(12) United States Patent
Pesaturo et al.

(10) Patent No.: US 12,509,271 B2
(45) Date of Patent: Dec. 30, 2025

(54) CONTAINMENT AND TRANSPORTATION TRAY FOR ELECTRONIC COMPONENTS HAVING SMALL DIMENSIONS AND LOW WEIGHT

(71) Applicant: STMICROELECTRONICS S.r.l., Agrate Brianza (IT)

(72) Inventors: Massimiliano Pesaturo, Torre de' Roveri (IT); Massimo Greppi, Basiano (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/735,020

(22) Filed: Jun. 5, 2024

(65) Prior Publication Data
US 2024/0317450 A1     Sep. 26, 2024

Related U.S. Application Data

(63) Continuation of application No. 17/746,758, filed on May 17, 2022, now Pat. No. 12,037,158.

(30) Foreign Application Priority Data

May 21, 2021   (IT) ........................ 102021000013307

(51) Int. Cl.
*B65D 1/36*        (2006.01)
*B65D 85/68*       (2006.01)
*H05K 13/00*       (2006.01)

(52) U.S. Cl.
CPC .............. *B65D 1/36* (2013.01); *B65D 85/68* (2013.01); *H05K 13/0084* (2013.01); *B65D 2585/86* (2013.01)

(58) Field of Classification Search
CPC .......... H05K 13/0084; H01L 21/67333; B65D 85/68; B65D 2585/86; B65D 1/36
(Continued)

(56) References Cited

U.S. PATENT DOCUMENTS 4,213,698 A      7/1980   Firtion et al.
4,702,266 A  *  10/1987   Chu ................. G01N 27/44704
                                                       206/509

(Continued)

FOREIGN PATENT DOCUMENTS

CN         1551290 A     12/2004
CN       101548373 A      9/2009
(Continued)

*Primary Examiner* — Chun Hoi Cheung
(74) *Attorney, Agent, or Firm* — Seed IP Law Group LLP

(57) ABSTRACT

Tray for containing electronic components formed by a bearing body, substantially planar, having a first and a second face. First holding structures extend from the first face of the bearing body and second holding structures extend from the second face of the bearing body. Each second holding structure is aligned with a respective first holding structure in a vertical direction perpendicular to the first and the second faces of the bearing body. Each first holding structure is formed by first protrusions mutually spaced by first spaces and arranged along a first closed line; each second holding structure is formed by second protrusions mutually spaced by second spaces and arranged along a second closed line. Each second protrusion is aligned, in parallel with the vertical direction, with the first spaces and each first protrusion is aligned, in parallel with the vertical direction, with the second spaces.

20 Claims, 6 Drawing Sheets

(58) Field of Classification Search
USPC ....... 206/725, 714, 722, 561, 724–727, 707, 206/706
See application file for complete search history.

(56) References Cited

U.S. PATENT DOCUMENTS

| | | | |
|---|---|---|---|
| 4,846,483 A | 7/1989 | Sorensen | |
| 5,303,466 A | 4/1994 | Ozai et al. | |
| 5,400,904 A | 3/1995 | Maston, III et al. | |
| 5,418,692 A | 5/1995 | Nemoto | |
| 5,664,680 A | 9/1997 | Hamlin | |
| 5,848,703 A * | 12/1998 | Murphy | H01L 21/67333 206/725 |
| 5,878,891 A * | 3/1999 | Bentley, II | H05K 13/0084 206/557 |
| 5,890,599 A | 4/1999 | Murphy | |
| 5,984,293 A | 11/1999 | Abrahamson et al. | |
| 6,357,595 B2 | 3/2002 | Sembonmatsu et al. | |
| 6,505,741 B1 | 1/2003 | Ono | |
| 6,688,300 B2 | 2/2004 | Tieber | |
| 6,914,771 B2 * | 7/2005 | Ono | H05K 13/0084 206/725 |
| 7,163,104 B2 | 1/2007 | Inoke et al. | |
| 7,757,862 B2 * | 7/2010 | Tamura | H01L 21/67333 206/503 |
| 8,937,483 B2 | 1/2015 | Jeong et al. | |
| 9,818,632 B2 * | 11/2017 | Lo | H01L 21/67333 |
| 10,189,654 B2 | 1/2019 | Herman et al. | |
| 2001/0023839 A1 * | 9/2001 | Kunii | B65D 21/00 206/509 |
| 2002/0066694 A1 | 6/2002 | Soh et al. | |
| 2005/0269242 A1 | 12/2005 | Crisp | |
| 2006/0054532 A1 * | 3/2006 | Ochi | H01L 21/67333 206/518 |
| 2008/0173569 A1 | 7/2008 | Forsyth | |
| 2009/0050519 A1 | 2/2009 | Tamura et al. | |
| 2012/0032054 A1 * | 2/2012 | Huang | H05K 13/0084 248/346.5 |
| 2018/0182654 A1 | 6/2018 | Uzoh | |
| 2018/0376631 A1 | 12/2018 | Ziadeh et al. | |
| 2022/0371766 A1 | 11/2022 | Pesaturo et al. | |

FOREIGN PATENT DOCUMENTS

| | | |
|---|---|---|
| EP | 0789393 A1 | 8/1997 |
| EP | 1049138 A2 | 11/2000 |
| JP | 2006100297 A | 4/2006 |
| KR | 19980066235 U | 12/1998 |
| KR | 20160099793 A | 8/2016 |

* cited by examiner

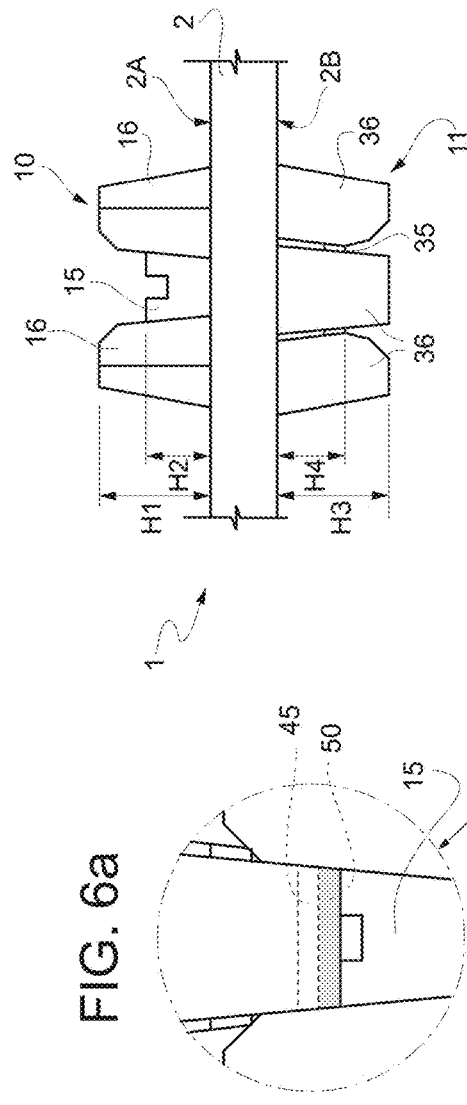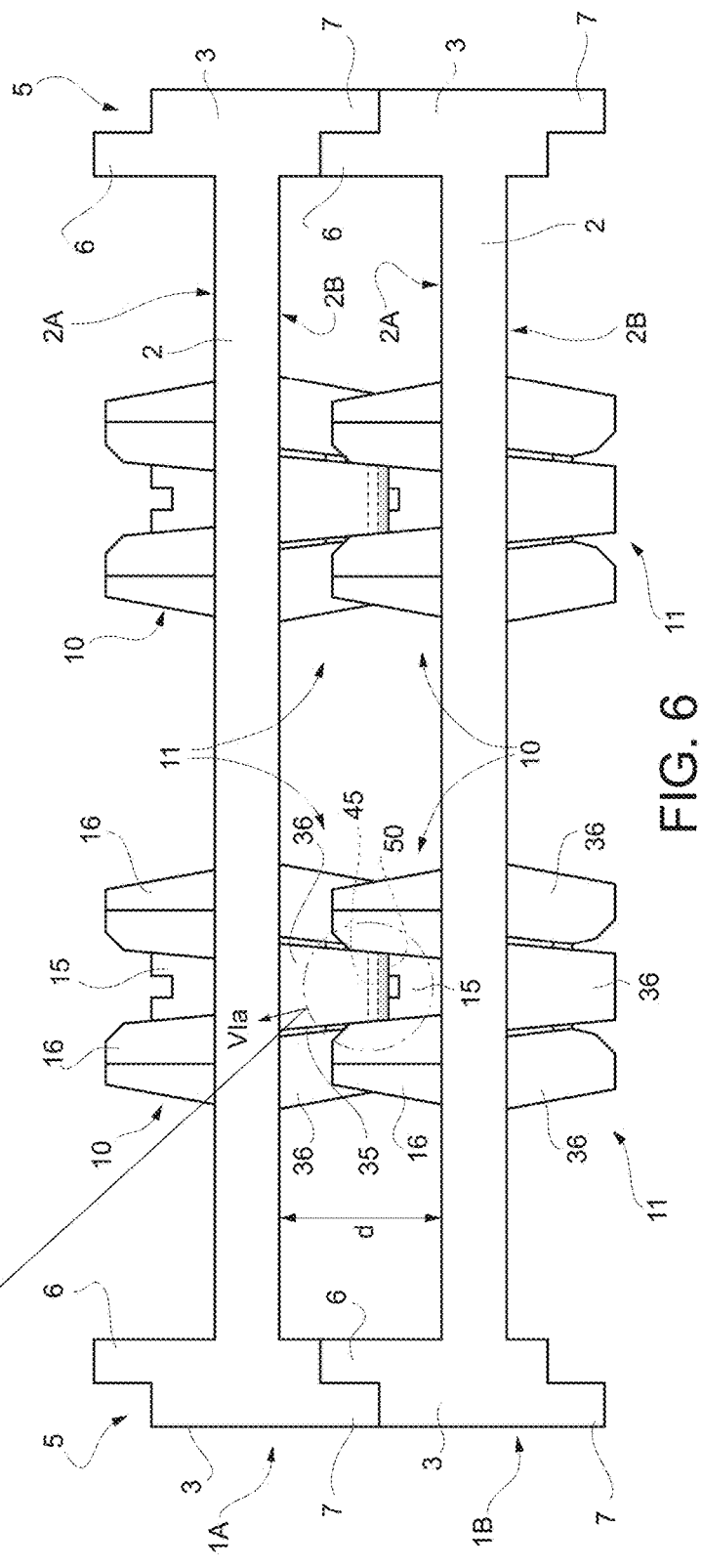

CONTAINMENT AND TRANSPORTATION TRAY FOR ELECTRONIC COMPONENTS HAVING SMALL DIMENSIONS AND LOW WEIGHT

BACKGROUND

Technical Field

The present disclosure relates to a containment and transportation tray for electronic components having small dimensions and low weight.

Description of the Related Art

As known, in the handling of electronic components to be subject to various processing steps (production, assembly, testing) or to be supplied to customers, trays are generally used that have a plurality of seats, also called "pockets," which are normally aligned as a matrix.

The electronic components (meaning there with both singulated dice and packaged chips) are generally arranged one per pocket, oriented in a desired manner, so that they may be picked up by handling machines (also called "pick and place" machines) through gripping elements having cylindrical shapes, called "barrels." These gripping elements, single or mutually aligned, are connected to a vacuum source and thus can suck the component(s) from the respective pockets, and, maintain the correct orientation thereof, placing them on supports (for example on tape reels) for further processing steps or for sale.

Normally, during transportation, the trays are stacked on each other, so that they may be transported or stocked together. In this case, each tray also forms a top wall for the components accommodated in the pockets of a respective bottom tray, to prevent them from coming out, moving or rotating, which would make it difficult or impossible for the handling machine to grip and correctly place the electronic components.

However, current devices, such as wearable devices, cell phones, drones, etc., demand a continuous reduction in the dimensions, thickness and weight of the used components. In particular, now LGA (Land Grid Array) or BGA (Ball Grid Array) devices currently developed for these applications have extremely small dimensions, with an area of, for example 2×2 $mm^2$ and a height of less than 1 mm (for example 0.55 mm). As a result of these small dimensions, the components are also extremely light, with a weight of a few milligrams.

However, this reduction in the dimensions and weight of the electronic components is problematic for the current trays, which, even when suitably sized, are not always capable of effectively holding the components and ensuring the desired position and orientation.

In fact, the components cannot be fitted in position in their respective seats, so as to allow a simple grip thereof, without any risk of damage, and are held in the pockets with a certain play.

Furthermore, due to the low weight of the components, even reduced air flows, for example due to the Venturi effect, when the trays are detached from each other, are sufficient for the components to move from the desired position, "flying" away, since the force of gravity is very low and holds them only weakly at the bottom of the pockets.

This means that more and more often, during transportation or detachment of the trays, the components axially rotate by 90° or more degrees, turn upside down, come out of the pockets and gather in a corner of the trays, or even slip into small interstices in the pockets due to the existing geometries. In some cases, it becomes even difficult to extract them and in any case the component pick up cannot be carried out by automatic pick and place machines.

BRIEF SUMMARY

The present disclosure provides a tray which overcomes the drawbacks of the prior art and allows the components to be safely held both during transportation and handling operations of the trays.

According to the present disclosure, a containment and transportation tray for electronic components is provided.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein:

FIG. 5 is an enlarged side view of the tray portion of FIGS. 2A and 2B, showing the first and the second seat portions;

FIG. 6 is a cross-section of a plurality of trays of FIG. 1, sectioned along section line VI-VI and mutually stacked;

FIG. 6a shows an enlarged detail of FIG. 6;

DETAILED DESCRIPTION

Figure 1:
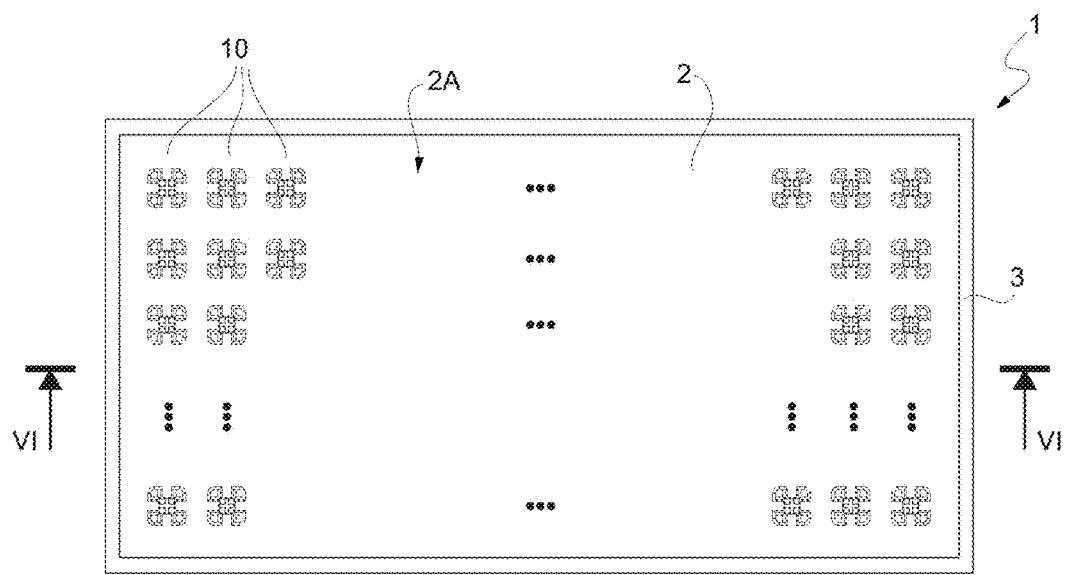
FIG. 1 is a top view of the present tray.

FIG. 1 shows a tray 1 for containing and transporting electronic components, meaning thereby both singulated dice and packaged chips, to be subject to further processing, testing or to be transported for sale. Specifically, the tray 1 is particularly suitable for electronic components having very small dimensions (e.g., 2×2 $mm^2$ or 2×2.5 $mm^2$), and low height (e.g., 0.55 mm) and therefore low weight (a few milligrams), but the present disclosures may be suitable for electronic components of any shape and size, by suitably sizing the tray 1. As a result, while the following description refers for simplicity to a component of parallelepiped shape with a square base, what is described below and shown in the Figures within the present disclosure applies, with small dimensional and shape changes, to components with a rectangular base, for example of truncated pyramid shape (such as, for example, in UV sensors).

The tray 1, typically of molded plastic, is formed by a bearing body 2, generally of rectangular shape, having a first face 2A and a second face 2B (FIG. 5) and provided with a frame 3. Here, the frame 3 extends perimetrally to the bearing body 2, for example, the frame 3 extends around the bearing body 2. Here, the first face 2A is opposite to the second face 2B.

With reference to FIG. 6, the frame 3 is thicker than the rest of the bearing body 2 and transversely protrudes both with respect to the first face 2A and with respect to the second face 2B of the bearing body 2.

The tray 1 is stackable, with the frames 3 of trays 1 being stacked to each other in mutual contact. In particular, to allow a correct mutual alignment of multiple trays 1, the frame 3 may have engagement means 5, which may alternatively be referred to as an engagement structure or some other similar or like reference to the engagement means 5.

For example, the frame 3 may have a top edge 6 and a bottom edge 7, counter-shaped to each other, here with the shape of respective steps. In the embodiment shown, the top edge 6 extends on an inner perimeter of the frame 3, in the portion protruding with respect to the first face 2A of the bearing body 2; the bottom edge 7 extends on an outer perimeter of the frame 3, in the portion protruding with respect to the second face 2B of the bearing body 2.

The frame 3 and the edges 6, 7 may have sizes and arrangements to couple with a small interference, aligning and mutually fitting trays 1 which are superimposed. In other words, the top edge 6 of the tray 1B at the bottom of FIG. 6 abuts the bottom edge 7 of the tray 1A at the top of FIG. 6 based on the orientation as shown in FIG. 6.

In any case, FIG. 6, the frame 3 (comprising the edges 6, 7) protrudes, with respect to the first and the second faces 2A, 2B of the bearing body 2, by an average height so as to define a distance d between bearing bodies 2 of stacked trays 1.

With reference to FIGS. 1-7, the tray 1 has first holding structures 10 transversely protruding from the first face 2A of the bearing body 2 and second holding structures 11 transversely protruding from the second face 2B of the bearing body 2. The first and the second holding structures 10, 11 are arranged so that each first holding structure 10 on the first face 2A of the bearing body 2 is vertically aligned, along an axis perpendicular to or transverse to the faces 2A, 2B of the bearing body 2, with a second holding structure 11, see in particular in FIGS. 5, 6.

Furthermore, as described in greater detail below and shown in FIG. 6, the shapes and the dimensions of the first and the second holding structures 10, 11 are such that the second holding structures 11 of a tray 1 arranged at the top (indicated by 1A in FIG. 6) fit in the first holding structures 10 of a tray 1 arranged at the bottom (indicated by 1B in FIG. 6).

Figure 2A:
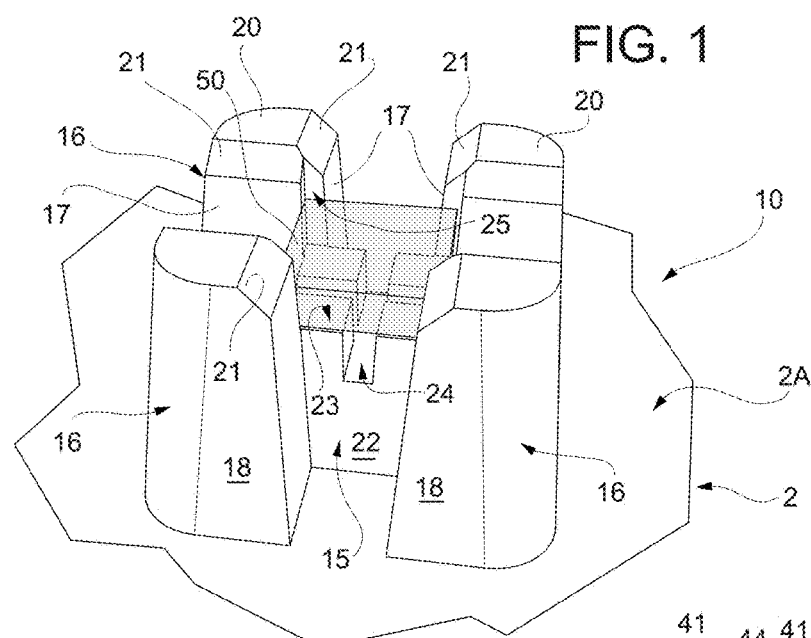
FIG. 2A is a top perspective view of a portion of the tray of FIG. 1 relating to a first part of a seat for integrated components.
Figure 3:
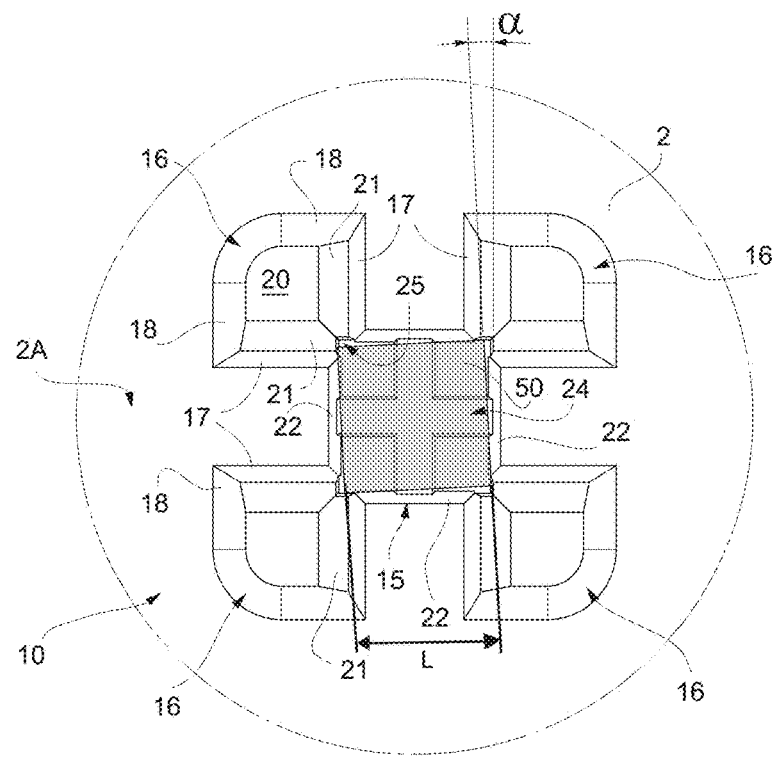
FIG. 3 is a top view of the first seat portion of FIG. 2A.

In detail, with reference to FIGS. 2A and 3, each first holding structure 10 comprises a first raised portion 15 having here, in plan, a square shape, and four first protrusions 16 arranged at mutual distance along the perimeter of the square shape of the first raised portion 15, and in particular on the corners of the first raised portion 15.

In practice, the first raised portion 15 is arranged among and is delimited by the first protrusions 16. In other words, the first protrusion 16 are spaced around the first raised portion 15.

The first protrusions 16 have a first height H1 (FIG. 5) and the first raised portion 15 has a second height H2, which is less than the first height H1.

Each first protrusion 16 has a generally truncated pyramid shape, delimited by two first inner lateral surfaces 17 (facing the first raised portion 15) and two first outer lateral surfaces 18, here mutually connected by a rounded corner. Each first protrusion 16 has a first base surface 20, remote with respect to the first face 2A of the bearing body 2 and generally transverse to the first inner lateral surfaces 17 and to the first outer lateral surfaces 18. The first base surface 20 is connected to the first inner lateral surfaces 17 through bevels 21 each extending transversely to the first base surface 20 and to the respective first inner lateral surfaces 17 and intended to facilitate the insertion of a component 50 (shown in ghost in FIGS. 2A, 3 and 6) and the stacking. The first base surface 20 may be referred to as a minor base surface or an end surface of the first protrusions 16.

Figure 7:
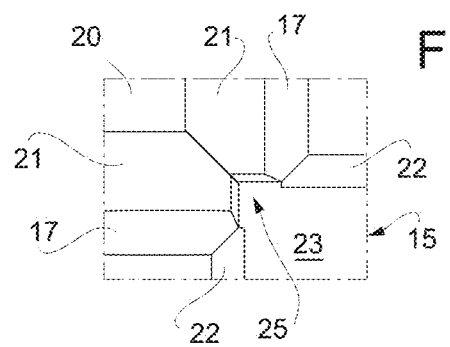
FIG. 7 is a top view of an enlarged detail of FIG. 3.

Each first protrusion 16 also has, along each corner formed by the respective first inner lateral surfaces 17, a notch 25 (see also the enlarged detail of FIG. 7). The notches 25 of all the first protrusions 16 of each first holding structure 10 are counter-shaped to the corners of the respective first raised portion 15 to hold the component 50 with play, as visible in FIG. 3.

Each first raised portion 15 has four transverse sides 22, each extending between pairs of first, adjacent protrusions 16 arranged, and a first planar face 23.

The first planar face 23 of each first raised portion 15 is generally parallel to the first face 2A of the bearing body 2 and therefore transverse to the first protrusions 16.

Furthermore, the first planar face 23 of each first raised portion 15 has a first groove 24, here cross-shaped with ends terminating at the transverse sides 22 of the respective first raised portion 15. In this manner, any air trapped underneath a component 50 (shown in ghost in FIGS. 2A, 3 and 6), resting against the first planar face 23, may escape laterally and does not form a cushion which could lead to the detachment of the component 50.

Figure 2B:
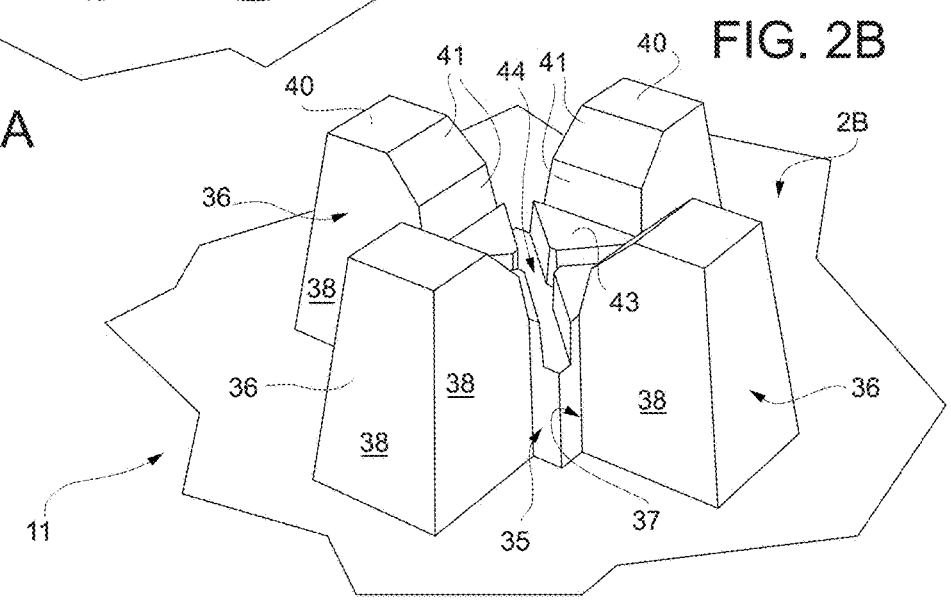
FIG. 2B is a bottom perspective view of the same tray portion of FIG. 2A, relating to a second part of the seat.
Figure 4:
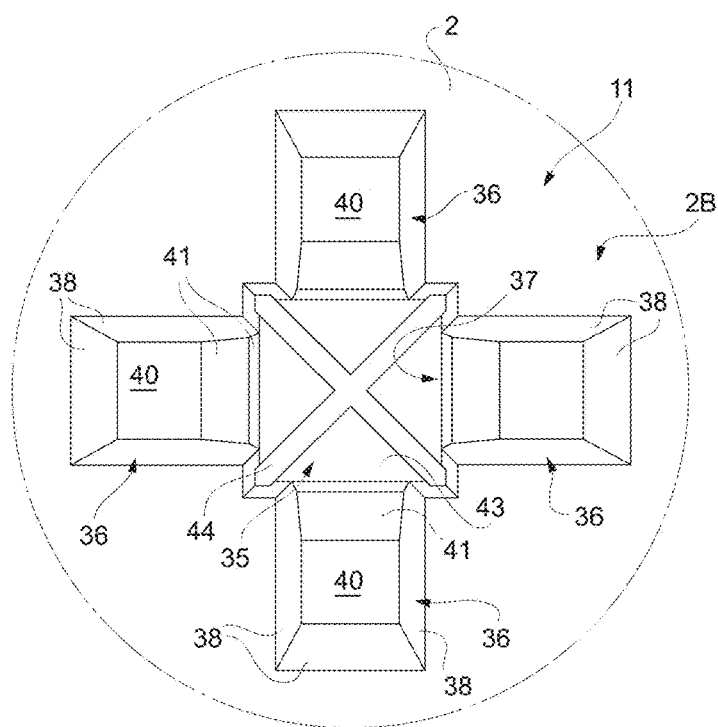
FIG. 4 is a bottom view of the second seat portion of FIG. 2B.

With reference to FIGS. 2B and 4, each second holding structure 11 comprises a second raised portion 35, having here, in plan, a square shape, and four second protrusions 36, arranged at mutual distance on the sides of the second raised portion 35.

In practice, the second raised portion 35 is arranged between and is delimited by the second protrusions 36. In other words, the four second protrusions 36 are spaced around the second raised portion 35.

The second protrusions 36 are arranged rotated by 45° with respect to the first protrusions 16, as is noted from the comparative observation of FIGS. 3 and 4, but the second raised portion 35 is angularly coincident with the first raised portion 15.

In practice, the first and the second raised portions 15, 35 are superimposed and vertically aligned with each other with respect to a vertical axis perpendicular to the first and the second faces 2A, 2B of the bearing body 2 and the second protrusions 36 are vertically aligned to the spaces between the first protrusions 16.

The second protrusions 36 have a third height H3 (FIG. 5) and the second raised portion 35 has a fourth height H4, which is less than the third height H3.

Each second protrusion 36 has here a generally oblique truncated cone shape, with a square base and a vertical axis which is not perpendicular to the second face 2B of the bearing body 2, as may be seen in particular in FIG. 5.

Furthermore, each second protrusion 36 is delimited by a second inner lateral surface 37 (facing the respective second raised portion 35) and three second outer lateral surfaces 38. The second inner lateral surfaces 37 of the second protrusions 36 of a same second holding structure 11 extend so as to approach to each other, starting from the second face 2B of the bearing body 2 (FIG. 5).

Each second protrusion 36 has a second base surface 40, remote with respect to the second face 2B of the bearing body 2, generally transverse to the second inner lateral surface 37 and to the second outer lateral surfaces 38. The second base surface 40 is connected to the second inner lateral surface 37 through one or more beveled surfaces 41 extending transversely to the second base surface 40 and to the second inner lateral surface 37. This arrangement is intended to facilitate the lateral containment of the component 50 without damaging it, as explained in detail hereinafter. The second base surface 40 may be referred to as a minor base surface or an end surface of the second protrusions 36.

This shape and arrangement of the second protrusions 36 therefore facilitates, together with the shape and arrangement of the first protrusions 16, the self-alignment and the fitting of the first and the second holding structures 10, 11.

Each second raised portion 35 has a second planar face 43 generally parallel to the second face 2B of the bearing body 2 and therefore transverse to the second protrusions 36.

In the embodiment of FIGS. 2B, 4-6, the second planar face 43 of each second raised portion 35 has a second groove 44 that is cross-shaped. The second groove 44 is for example rotated by 45° with respect to the first groove 24; therefore it has ends terminating at the corners of the second planar face 43, between the second inner surfaces 37 of pairs of second protrusions 36 adjacent to each other. The second groove 44 also allows the lateral outflow of the air while stacking the trays 1 and prevents depressions and the Venturi effect while removing the trays 1 from the stack, as discussed hereinafter.

The dimensions of the first and the second protrusions 16, 36 are chosen so as to allow the first and the second protrusions 16, 36 to mutually fit and form a containment chamber, as discussed below.

In particular, as visible in FIG. 6, the heights H1 and H3 are designed so that, when the trays 1 are stacked, as shown in FIG. 6, the second protrusions 36 of a top tray 1A insert between the first protrusions 16 of a bottom tray 1B.

In other words, the sum of the heights H1 and H3 of the first protrusions 16 and of the second protrusions 36 is greater than the distance d as shown in FIG. 6:

$$(H1 + H3) > d \quad (1)$$

Furthermore, the width of the second protrusions 36 (distance between two outer surfaces 38, not adjacent, belonging to a same second protrusion 36) of the top tray 1A are chosen so that, when the trays 1A and 1B are stacked (FIG. 6), there is at least one horizontal section plane (parallel to the first and the second faces 2A, 2B of the bearing body 2) where this width is approximately equal to, or slightly greater than, the distance, on the same horizontal section plane, between the first protrusions 16 of the bottom tray 1B, and vice versa.

Furthermore, the mutual dimensional ratios are designed so that, after stacking, the space between the first raised portions 15 of the bottom tray 1B and the second raised portions 35 of the top tray 1A is slightly greater than the thickness of the component 50 (and however smaller than the dimensions of the sides of the component 50, so as to prevent it from flipping over).

As a result, the sum of the heights H2 and H4 of the first raised portions 15 and of the second raised portions 35 is lower than the distance d between the two trays 1A, 1B:

$$(H2 + H4) < d \quad (2)$$

Furthermore, calling L the side of the component 50, the following relation applies:

$$(H2 + H4 + L) > d, \quad (3)$$

so that the free space above the component 50 does not, in any case, allow it to flip, while allowing it to move in the height direction to a certain amount.

Furthermore, the area of the first and the second raised portions 15, 35 is chosen according to the components to be transported.

In particular, the length of the sides of the planar faces 23, 33 of the first and the second raised portions 15, 35 is chosen so as to be slightly greater than the side L of the components 50. In particular, as shown in FIG. 3, these dimensions are chosen so that the components 50 may rotate, with respect to a position completely aligned with the sides of the planar faces 23, by an angle α of at most 5°.

In this manner, the components 50 are held each with a small play in the space between the planar faces 23, 43, without being capable of coming out or overturning.

In use, a pick and place machine inserts each component 50 in a respective first holding structure 10, to rest against the respective first planar face 23. The flared shape of the first and the second protrusions 16, 36 and the dimensions of the first faces 23 facilitate a correct insertion of the components 50.

During stacking, as already indicated, the second protrusions 36 of the top tray 1A insert into the space between the first protrusions 16 of the bottom tray 1B, facilitated by the flared shape of the protrusions 16, 36. In this step, as indicated, the protrusions 16, 36 may slightly get stuck together, creating a force coupling.

In this manner, each first holding structure 10 of the top tray 1A forms, with a respective second holding structure 11 of the bottom tray 1B, a chamber 45 surrounded by the respective planar faces 23, 33 and by the respective first and second protrusions 16, 36.

As discussed above, each chamber 45 accommodates a respective component 50 with play, so that both its placing and its picking-up are simple and do not entail any risk of damage or incorrect insertion/pick-up or loss of the component.

Furthermore, in particular while stacking and thus closing the chambers 45, the grooves 24, 44 allow the air to outflow/enter, avoiding in the first case a local pressure increase which complicates the introduction and in the second case a depression causing a force on the component 50 which might cause the component 50 to "jump off". In other words, the grooves 22, 44 allow the air to escape without causing the component 50 to "jump off" or "fly away."

However, due to the open shape of the chambers 45, the presence of both grooves 24, 44 is not essential and/or the grooves 24, 44 may have a different shape.

Figure 8:
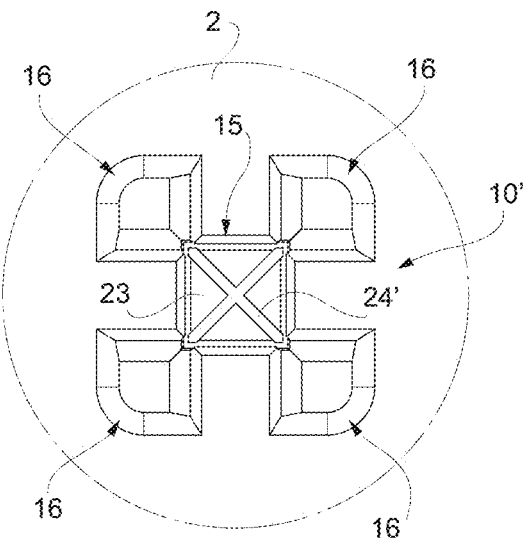
FIG. 8 is a top view of a different embodiment of the first seat portion of the tray of FIG. 1.

For example, FIG. 8 shows an embodiment wherein the first holding structure, here indicated by 10', has a first groove, indicated by 24', rotated by 45° with respect to the first groove 24 of FIGS. 2A and 3; therefore it has ends terminating at the corners of the first planar face 23, between the notches 25.

Figure 9:
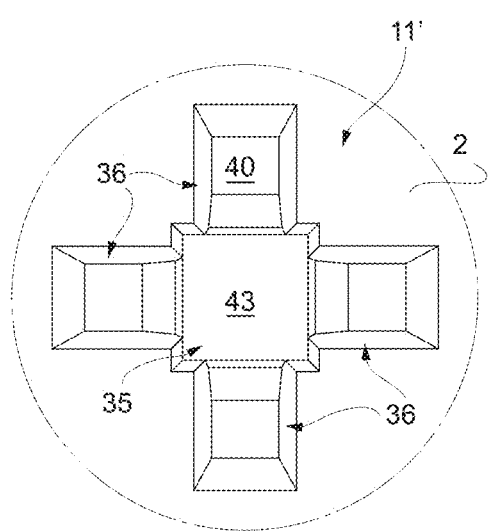
FIG. 9 is a bottom view of a different embodiment of the second seat portion of the tray of FIG. 1.

In this case, in a manner not shown, also the second holding structure 11 may have the second groove 44 rotated by 45°, and therefore is similar to the first groove 24 of FIGS. 2A and 3, or no groove at all, as shown in FIG. 9.

In FIG. 9, the second holding structure, here indicated by 11', has no groove. This solution is applicable when the first groove 24, 24' (FIGS. 3, 8) allows a sufficient and rapid outflow/inflow of air during stacking/removing the trays 1.

Figure 10:
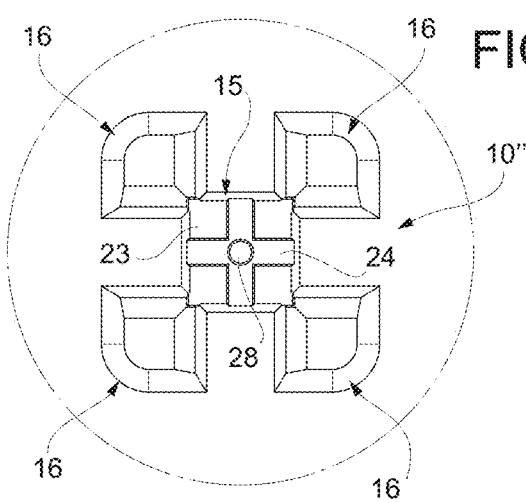
FIG. 10 is a top view of yet another embodiment of the first seat portion of the tray of FIG. 1.

FIG. 10 shows a different embodiment of the first holding structure, here indicated by 10", having a recess 28 in the center of the first planar face 23. The same solution may also be adopted for the second holding structure 11, in a manner not shown.

The tray 1 may be provided with alignment structures, using molds and solutions similar to those of the holding structures.

Figure 11:
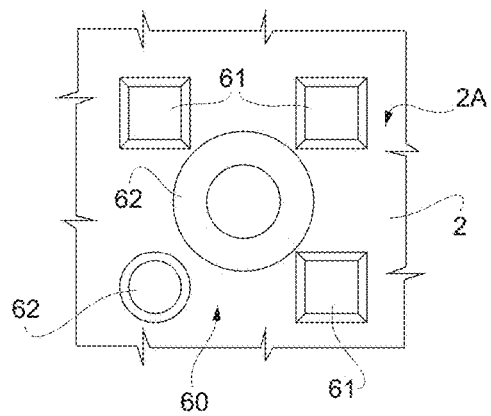
FIG. 11 is a top view of an alignment structure of the tray of FIG. 1.
Figure 12:
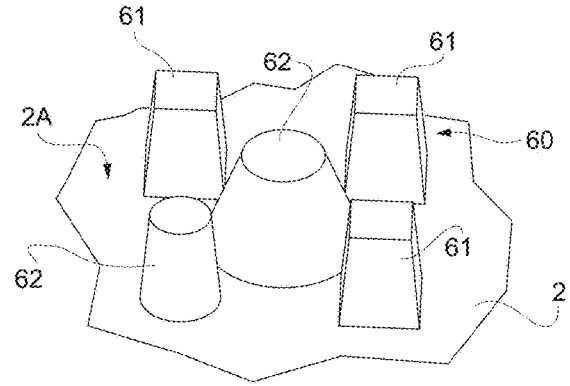
FIG. 12 is a perspective view of the alignment structure of FIG. 11.

For example, FIGS. 11 and 12 show possible alignment structures 60 formed on the first face 2A of the bearing body 2.

In the embodiment shown, the alignment structures 60 comprise truncated pyramids 61 and truncated cones 62, of different size and diameter of the bases. In fact, the pick and place machines have different recognition abilities, and the variety of shapes allows a matching to the different characteristics of these machines. Furthermore, by variously arranging the alignment structures 60, it is possible not only to identify the position of the alignment structures and therefore of the tray 1, but also to assess the angular position thereof.

Figure 13:
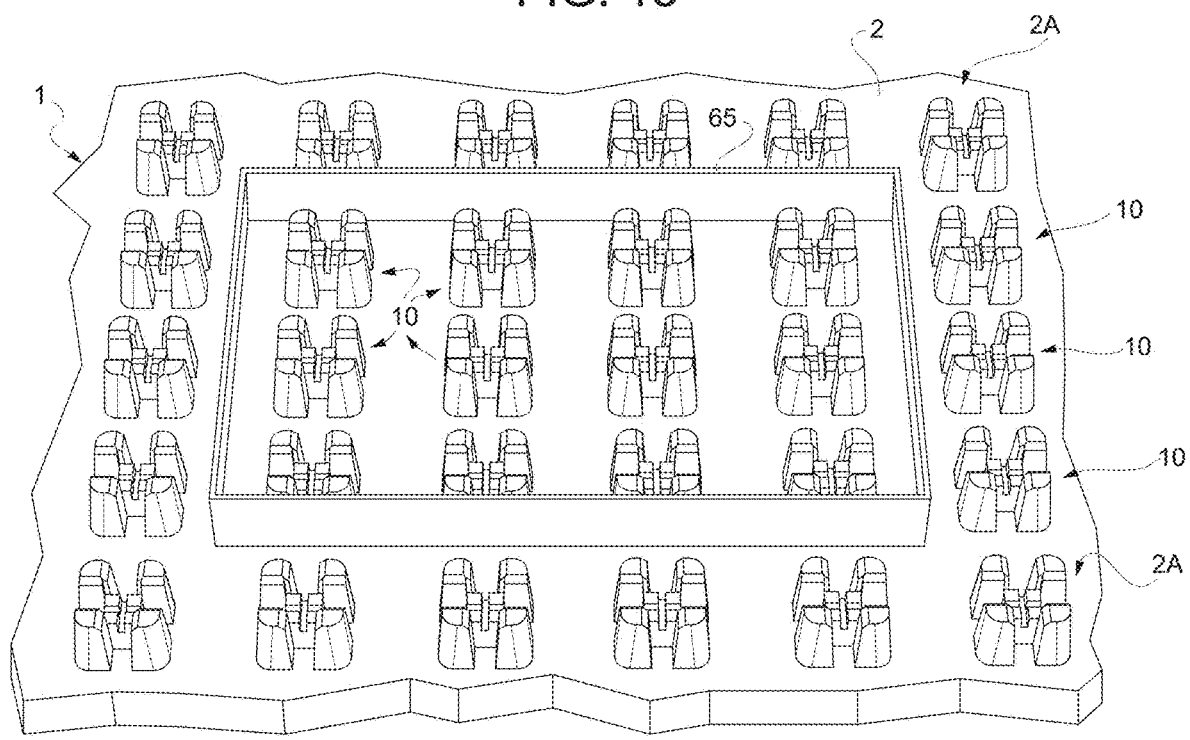
FIG. 13 is a perspective view of a gripper of the tray of FIG. 1.
Figure 14:
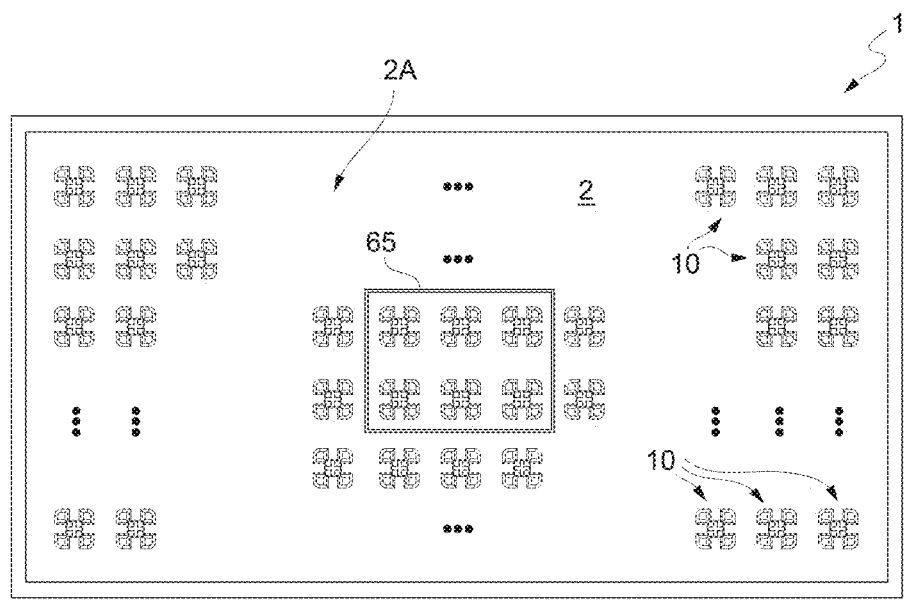
FIGS. 14 and 15 show two arrangement variants of the gripper of the tray of FIG. 13, in two different embodiments.
Figure 15:
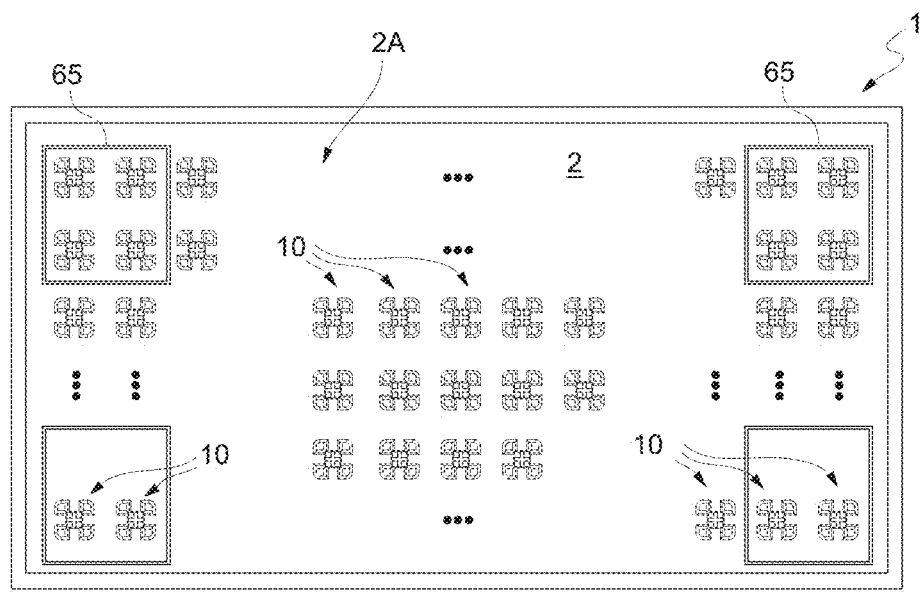

The tray 1 may also be provided with grippers, as shown in FIGS. 13-15. In detail, in FIGS. 13 and 14, the grippers comprise a wall 65 extending along the sides of a closed line, here the perimeter of a rectangle, on the first face 2A of the bearing body 2. In the embodiment of FIG. 15, multiple walls 65 are arranged on the tray 1, here four walls 65 arranged in proximity to the corners of the bearing body 2. In both cases, the walls 65 may surround one or more holding structures 10 and have a greater height with respect to them.

The grippers allow the trays 1 to be lifted and automatically aligned. In particular, while handling a tray 1, for arranging it on a stack of trays or removing it from the stack, a pad of the pick and place machine may be arranged above the wall(s) 65, and create a vacuum in the space delimited by each wall 65.

The position of the pad may be automatically controlled by virtue of the alignment structures 60, recognizable by camera systems. The alignment may be performed in two steps: a first step of recognition of the area concerned, and a second step of more precise positioning and alignment of the pick and place machine to the tray 1, arranged on the top.

In this manner, the tray may be lifted and transported. In the event that the wall(s) 65 surround the holding structures 10, these are suitably empty and do not accommodate components 50.

The tray described herein has numerous advantages, highlighted by the foregoing description.

In particular, it is emphasized here that the tray is particularly suitable for containing electronic components of small and very small dimensions and low weight, without damaging them, since the shape of the holding structures 10, 11 allows their insertion and extraction without any effort or risk for the electronic component 50 of getting stuck, while allowing limited movement and rotation, which prevent the electronic components 50 from overturning or getting out of the chambers 45.

The shape of the holding structures 10, 11, here of a truncated pyramid, allows the self-alignment and self-containment of the electronic components 50.

Furthermore, the shape of the holding structures 10, 11 makes the tray 1 simple to mold and to extract from the mold.

The electronic components 50 are easily accessible for their placing and their grip; and are safely held in their respective chambers 45.

The presence of grippers favors the handling of the trays 1; the presence of alignment structures 60 favors the correct placing and orientation with respect to the pick and place machine.

Finally, it is clear that modifications and variations may be made to the tray described and illustrated herein without thereby departing from the scope of the present disclosure, as defined in the attached claims.

For example, the exact shape of the first and the second protrusions 16, 36, may vary, as well as the shape of the grooves 24, 44, which may also be missing.

Similarly, the exact shape of the first and the second planar faces 23, 43 of the raised portions 15, 35 may differ from what has been shown; for example the first and the second planar faces 23, 43 may be the same or different from each other, and/or the same or different with respect to the shape of the components 50.

The raised portions 15, 35 may be missing or raised portions may be provided only on the first or only on the second face 2A, 2B of the bearing body 2.

Furthermore, while in the embodiments shown, the first protrusions 16 extend on the corners of the first face 23 and the second protrusions 36 extend along the sides of the second planar face 43, such arrangement may be reversed, with the first protrusions 16 extending along the sides of the first face 23 and the second protrusions 36 extending on the corners of the second planar face 43.

A tray (1) for containing electronic components, may be summarized as including a bearing body (2), substantially planar, having a first and a second face (2A, 2B); first holding structures (10) extending from the first face (2A) of the bearing body (2); second holding structures (11) extending from the second face (2B) of the bearing body (2), each second holding structure (11) being aligned with a respective first holding structure (10) in a vertical direction perpendicular to the first and the second faces (2A, 2B) of the bearing body (2); wherein each first holding structure (10) includes first protrusions (16) mutually spaced by first spaces and arranged along a first closed line, each second holding structure (11) includes second protrusions (36) mutually spaced by second spaces and arranged along a second closed line, each second protrusion (36) being aligned, parallel to the vertical direction, with the first spaces and each first protrusion (16) being aligned, parallel to the vertical direction, with the second spaces.

The first protrusions (16) of each first holding structure (10) may have respective first lateral surfaces (17) facing the first spaces and the second protrusions (36) may have second lateral surfaces (38) facing the second spaces; the first lateral surfaces (17), facing each other, of pairs of adjacent first protrusions (16) may be tilted and get away from each other, starting from the first face (2A) of the bearing body (2); and the second lateral surfaces (38), opposite to each other, of each second protrusion (36) may be tilted and approach each other starting from the second face (2B) of the bearing body (2).

The distance between at least two points of the first lateral surfaces (17), facing each other, of the pairs of adjacent first protrusions (16), wherein the two points belong to a first plane parallel to the first face (2A) of the bearing body (2), may be equal to or less than the width of the second protrusions (36), measured between the second lateral surfaces (37), opposite to each other, of each second protrusion (36) in at least one second plane parallel to the second face (2B) of the bearing body (2).

The first and the second protrusions (16, 36) may be truncated pyramid-shaped with a respective major base surface contiguous to the first and, respectively, to the second faces (2A, 2B) of the bearing body (2) and a respective minor base surface (20, 40) opposite the respective major base surface.

The first and the second lateral surfaces (17, 38) may have entry bevels (21, 41), adjacent to the respective minor base surface (20, 40).

The first holding structures (10) may have a first raised portion (15) protruding with respect to the first face (2A) of the bearing body (2), the first raised portion (15) being surrounded by the first protrusions (16) and having a first planar surface (23) substantially parallel to the first face (2A) of the bearing body (2), the first planar surface (23) having, in plane view, a polygonal shape and being a rest surface for an electronic component (50).

The second holding structures (11) may have a second raised portion (35) protruding with respect to the second face (2B) of the bearing body (2), the second raised portion (35) being surrounded by the second protrusions (36) and having a second planar surface (43) substantially parallel to the second face (2B) of the bearing body (2), the second planar surface (43) having, in plane view, a polygonal shape and being a top closing surface for a containment chamber (45) for an electronic component (50).

The polygonal shape of the first planar surface (23) may have a plurality of corners, the first protrusions (16) extend alongside the corners of the first planar surface (23), the polygonal shape of the second planar surface (43) may have a plurality of sides and the second protrusions (36) extend alongside the sides of the polygonal shape of the second planar surface (43).

Each first protrusion (16) may have a notch (25) extending transversely to the first face (23) of the bearing body 2, between the first lateral surfaces 17.

The first planar surface (23) of each first holding structure (10) may have a first groove (24) extending between opposite sides or corners of the respective first planar surface (23).

The second planar surface (43) of each second holding structure (11) may have a second groove (44) extending between opposite sides or corners of the respective second planar surface (43).

The tray may further include alignment structures 60 protruding from the first face (2A) of the bearing body (2).

The tray may further include at least one wall-shaped gripper (65) extending from the first face (2A) of the bearing body (2) along the sides of a closed line, the wall-shaped gripper (65) having a greater height than the first protrusions (16).

A tray stack, may include a first tray (1B) and a second tray (1A), wherein the second tray (1A) may be configured to be stacked on top of the first tray (1B), wherein the first protrusions (16) of the first holding structures (10) of the first tray (1B) extend into the second spaces between the second protrusions (36) of the second holding structures (11) of the second tray (1A).

The first and the second trays (1B), (1A) may be made wherein the first protrusions (16) of the first holding structures (10) of the first tray (1B) may be fitted in the second spaces between the second protrusions (36) of the second holding structures (11) of the second tray (1A) and encompass a containment chamber (45) for an electronic component (50).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A tray, comprising:
   a bearing body having a first face and a second face opposite to the first face;
   one or more first alignment structures are at the first face of the bearing body, the one or more first alignment structures includes:
   one or more first truncated portions having a first truncated shape and profile, wherein the first truncated shape and profile is a truncated pyramid; and
   a plurality of second truncated portions having a second truncated shape and profile different from the first truncated shape, wherein the second truncated shape and profile is a truncated cone;
   a plurality of first holding structures along the first face of the bearing body, the plurality of first holding structure having a first profile and shape; and
   a plurality of second holding structures along the second face of the bearing body, the plurality of second holding structures having a second profile and shape different from the first profile and shape,
   wherein the plurality of second truncated portions having the second truncated shape and profile of the truncated cone include:
   a central truncated cone; and
   a peripheral truncated cone spaced outward from the central truncated cone; and
   wherein the one or more first truncated portions having the first truncated shape and profile of the truncated pyramid include:
   a first truncated pyramid spaced outward from the central truncated cone and spaced apart from the peripheral truncated cone.

2. The tray of claim 1, wherein the one or more first truncated portions having the first truncated shape and profile of the truncated pyramid further includes:
   a second truncated pyramid spaced outward from the central truncated cone, spaced apart from the peripheral truncated cone, and spaced apart from the first truncated pyramid; and a third truncated pyramid spaced outward from the central truncated cone, spaced apart from the peripheral truncated cone, spaced apart from the first truncated pyramid, and spaced apart from the second truncated pyramid.

3. The tray of claim 2, wherein the alignment structure is configured to, in operation, be recognizable by a camera system to align a pick and place machine with respect to the bearing body.

4. The tray of claim 1, wherein the alignment structure is configured to, in operation, be recognizable by a camera system to align a pick and place machine with respect to the bearing body.

5. The tray of claim 1, wherein:
each of the one or more first holding structures includes a plurality of first protrusions spaced apart from each other by a plurality of first spaces, each of the one or more first holding structures includes a first raised portion that extends from the first face, the first raised portion includes a plurality of first sidewalls and a plurality of first corners, each respective first space of the plurality of first spaces is at a corresponding first sidewall of the plurality of first sidewalls, and each respective first protrusion of the plurality of first protrusions is at a corresponding first corner of the plurality of first corners, and
each one of the one or more second holding structures includes a plurality of second protrusions spaced apart from each other by a plurality of second spaces, each one of the plurality of second protrusions aligned with the first spaces and each first protrusion being aligned, parallel to the vertical direction, with the second spaces, each of the one or more second holding structures includes a second raised portion that extends from the second face, the second raised portion includes a plurality of second sidewalls and a plurality of second corners, each respective second space of the plurality of second spaces is at a corresponding second corner of the plurality of second corners, and each respective second protrusion of the plurality of second protrusions is at a corresponding second sidewall of the plurality of second sidewalls.

6. The tray of claim 1, wherein the central truncated cone is a different size and profile than the peripheral truncated cone.

7. The tray of claim 6, wherein the central truncated cone is larger than the second truncated cone.

8. A tray, comprising:
a first surface and a second surface opposite to the first surface;
a first holding structure including a plurality of first protrusions that extends from the first surface, each respective first protrusion of the plurality of first protrusions has a first truncated pyramid-shape and a first height, the first holding structure further includes a first central raised portion that extends from the first surface to a second height less than the first height, the plurality of first protrusions are located around the first central raised portion, and each respective first protrusion of the plurality of first protrusions is spaced apart from each other; and
a second holding structure including a plurality of second protrusions that extends from the second surface, each respective second protrusion of the plurality of second protrusions has a second truncated pyramid-shape and a third height, the second holding structure further includes a second central raised portion that extends from the second surface to a fourth height less than the third height, the plurality of second protrusions are located around the second central raised portion, and each respective second protrusion of the plurality of second protrusions is spaced apart from each other, and
wherein the first truncated pyramid-shape is configured to engage with the second truncated pyramid shape, and the second truncated pyramid-shape is configured to engage with the first truncated pyramid-shape.

9. The tray of claim 8, wherein:
the first central raised portion includes a plurality of first corners; and
each respective first protrusion of the plurality of protrusions is at a corresponding first corner of the plurality of first corners.

10. The tray of claim 9, wherein:
the second central raised portion includes a plurality of second corners; and
each respective second protrusion of the plurality of second protrusions is between a corresponding pair of second corners of the plurality of second corners.

11. The tray of claim 10, wherein each respective second protrusion of the plurality of second protrusions is at a midpoint between the corresponding pair of second corners of the plurality of second corners.

12. The tray of claim 8, further comprising one or more alignment structures at the first surface.

13. The tray of claim 12, wherein the one or more alignment structures include:
one or more first truncated portions having a first truncated shape and profile; and
one or more second truncated portions having a second truncated shape and profile different from the first truncated shape.

14. A tray, comprising:
a bearing body having a first face and a second face opposite to the first face;
one or more first alignment structures are at the first face of the bearing body, the one or more first alignment structures includes:
a central truncated portion being a first truncated cone with a first base diameter;
a first peripheral truncated portion spaced apart from the central truncated portion, the first peripheral truncated portion having a first truncated pyramid shape;
a second peripheral truncated portion spaced apart from the central truncated portion and the first peripheral truncated portion, the second peripheral truncated portion being a second truncated cone with a second base diameter different from the first base diameter
a plurality of first holding structures along the first face of the bearing body, the plurality of first holding structure having a first profile and shape; and
a plurality of second holding structures along the second face of the bearing body, the plurality of second holding structures having a second profile and shape different from the first profile and shape.

15. The tray of claim 14, wherein the first base diameter is greater than the second base diameter.

16. The tray of claim 15, further comprising:
a third peripheral truncated portion spaced apart from the central truncated portion, the first peripheral truncated portion, and the second peripheral truncated portion, the third peripheral truncated portion being a second truncated pyramid shape; and
a fourth peripheral truncated portion spaced apart from the central truncated portion, the first peripheral truncated portion, the second peripheral truncated portion, and the third peripheral truncated portion, the fourth peripheral being a third truncated pyramid shape.

17. The tray of claim 16, wherein the first truncated pyramid shape, the second truncated pyramid shape, and the third truncated pyramid shape are the same.

18. The tray of claim 14, wherein each of the one or more first holding structures includes a plurality of first protrusions spaced apart from each other by a plurality of first spaces, each of the one or more first holding structures includes a first raised portion that extends from the first face, the first raised portion includes a plurality of first sidewalls and a plurality of first corners, each respective first space of the plurality of first spaces is at a corresponding first sidewall of the plurality of first sidewalls, and each respective first protrusion of the plurality of first protrusions is at a corresponding first corner of the plurality of first corners.

19. The tray of claim 18, wherein each one of the one or more second holding structures includes a plurality of second protrusions spaced apart from each other by a plurality of second spaces, each one of the plurality of second protrusions aligned with the first spaces and each first protrusion being aligned, parallel to the vertical direction, with the second spaces, each of the one or more second holding structures includes a second raised portion that extends from the second face, the second raised portion includes a plurality of second sidewalls and a plurality of second corners, each respective second space of the plurality of second spaces is at a corresponding second corner of the plurality of second corners, and each respective second protrusion of the plurality of second protrusions is at a corresponding second sidewall of the plurality of second sidewalls.

20. The tray of claim 18, wherein the first profile and shape of the plurality of first holding structures at the first face of the bearing body is configured to, in operation, be received by the second profile shape of the plurality of second holding structures of another bearing body.

* * * * *